US006968762B1

(12) United States Patent
Muckle et al.

(10) Patent No.: US 6,968,762 B1
(45) Date of Patent: Nov. 29, 2005

(54) PIPE PREPARING TOOL V

(75) Inventors: Derek Muckle, Long Whatton (GB); Gordon Leslie Lilley, Wakefield (GB); Ian Smith, Wakefield (GB); Steven Garfield Farrar, Dewsbury (GB); Paul Nicholas Myers, Wakefield (GB)

(73) Assignees: Caldervale Technology Limited, West Yorkshire (GB); Uponor Limited, Derbyshire (GB)

( * ) Notice: Subject to any disclaimer, the term of this patent is extended or adjusted under 35 U.S.C. 154(b) by 0 days.

(21) Appl. No.: 09/979,364

(22) PCT Filed: May 19, 2000

(86) PCT No.: PCT/GB00/01840

§ 371 (c)(1), (2), (4) Date: Mar. 25, 2002

(87) PCT Pub. No.: WO00/71288

PCT Pub. Date: Nov. 30, 2000

(30) Foreign Application Priority Data

May 25, 1999 (GB) .................................. 9912091

(51) Int. Cl.[7] .............................................. B21F 13/00

(52) U.S. Cl. ............................. 83/54; 83/875; 83/924; 30/90.4; 81/9.4

(58) Field of Search ................................ 30/90.6, 90.7, 30/90.9, 91.2; 83/54, 875, 924; 81/9.4

(56) References Cited

U.S. PATENT DOCUMENTS

| | | | | |
|---|---|---|---|---|
| 1,866,095 A | * | 7/1932 | Foley | 30/90.7 |
| 2,329,805 A | | 9/1943 | Wilson | 30/90.4 |
| 2,364,397 A | | 12/1944 | Staley | 30/91.1 |
| 2,385,368 A | * | 9/1945 | Montgomery | 30/90.9 X |
| 2,456,882 A | | 12/1948 | Mackey | 30/90.6 |
| 2,561,099 A | | 7/1951 | Costelow | 30/91.1 |
| 2,778,105 A | * | 1/1957 | Carta | 30/90.9 X |
| 3,082,523 A | * | 3/1963 | Modes et al. | 30/90.9 X |
| 3,218,709 A | | 11/1965 | Norton | 30/90.9 |
| 3,722,092 A | * | 3/1973 | Lukas | 30/90.6 X |
| 3,818,590 A | * | 6/1974 | Peter et al. | 30/90.9 X |
| 3,943,626 A | | 3/1976 | Williams | |
| 4,489,491 A | | 12/1984 | Gregson | 30/90.7 |
| 4,656,910 A | | 4/1987 | Peterson | 83/875 |
| 5,887,346 A | * | 3/1999 | McCasland | 30/90.6 X |

FOREIGN PATENT DOCUMENTS

| | | |
|---|---|---|
| DE | 196 11 749 A1 | 10/1997 |
| DE | 297 15 954 U1 | 11/1997 |
| EP | 0 213 061 A2 | 3/1987 |
| EP | 0 487 948 A2 | 6/1992 |
| EP | 0474583 | 11/1992 |
| GB | 1 443 622 | 7/1976 |
| GB | 1458366 | 12/1976 |
| GB | 1487033 | 9/1977 |
| GB | 2145647 | 4/1985 |
| GB | 2207377 | 2/1989 |
| GB | 2296886 | 7/1996 |
| WO | WOA9215818 | 9/1992 |
| WO | WOA9300212 | 1/1993 |
| WO | WOA9622485 | 7/1996 |

* cited by examiner

*Primary Examiner*—Charles Goodman
(74) *Attorney, Agent, or Firm*—Fish & Richardson P.C.

(57) ABSTRACT

This invention relates to pipe preparing tools, and more particularly to a novel pipe preparing tool suitable for cutting, scoring or penetrating a surface of a plastics pipes.

20 Claims, 9 Drawing Sheets

8
4
2
9
11
11
10
12
10
1

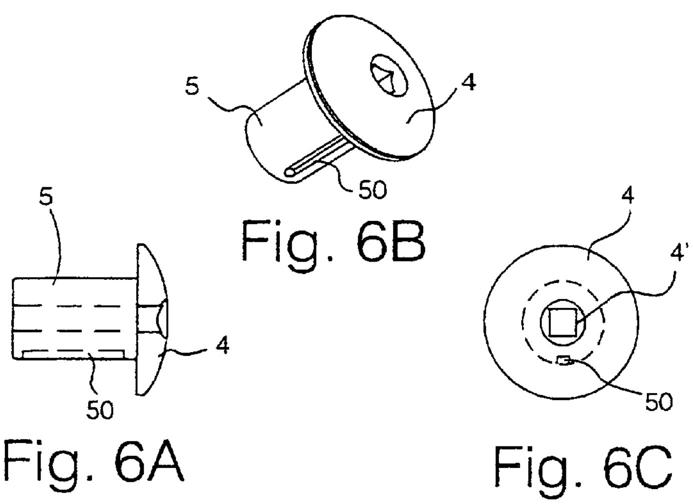
Fig. 6B
Fig. 6A
Fig. 6C
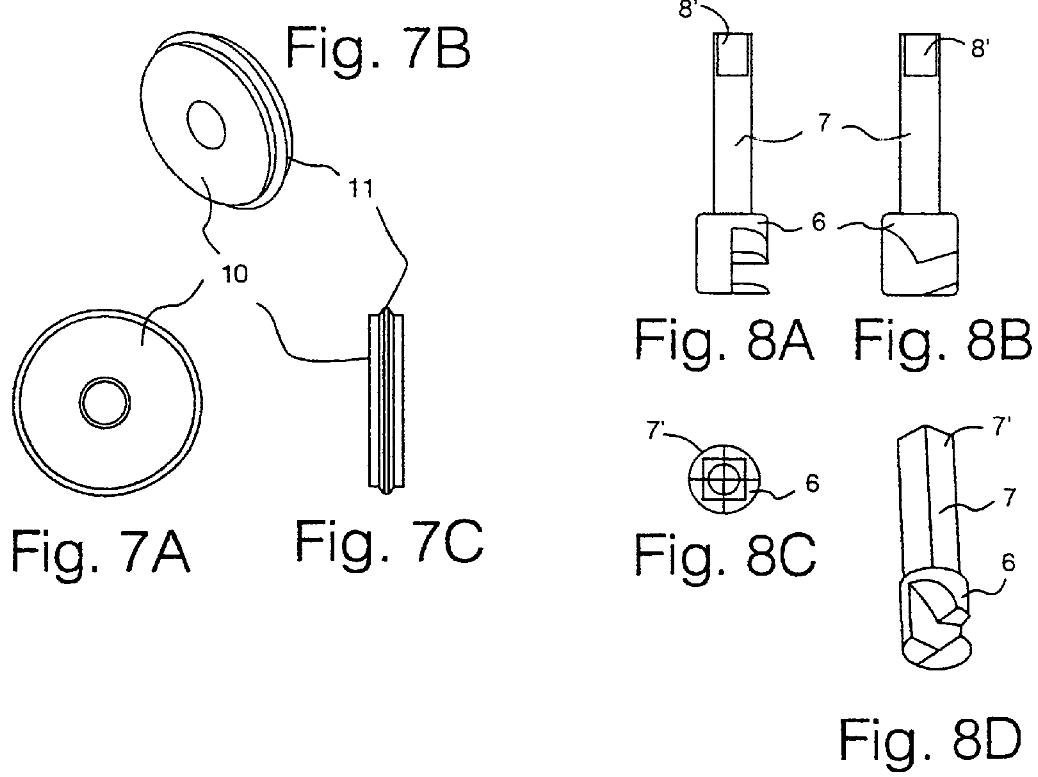
Fig. 7B
Fig. 7A
Fig. 7C
Fig. 8A
Fig. 8B
Fig. 8C
Fig. 8D

PIPE PREPARING TOOL V

BACKGROUND

This invention relates to pipe preparing tools, and more particularly to a novel pipe preparing tool suitable for cutting, scoring or penetrating a surface of a plastics pipe.

Composite plastics pipes comprising an inner core and an outer protective layer are known. The outer protective layer may, for example, provide environmental protection, or protection against mechanical damage when the pipe is laid in a trench. In joining sections of such a pipe, it has been proposed to remove the outer protective layer in order to permit the installation of a pipe coupler, such as, for example, an electrofusion pipe coupler. Examples of such pipes with outer protective layers are described in WO-A-9300212, WO-A-9215818, European Patent Application No. 0474583 and in WO-A-9622485, the entire disclosures of which are incorporated herein by reference for all purposes.

In practice it has proved to be extremely difficult to remove the outer protective layer cleanly from the pipe inner core without damaging the inner core when using conventional tools such as knives, scrapers etc.

In GB1487033 there is described a tube cutting and chamfering tool comprising an adjustable C-shaped frame, a pair of spaced cutting wheels arranged in a common plane, supporting rollers for the tube, and a chamfering cutter adjustably located between the two cutting wheels. This tool is quite complex in design and is not readily adapted to remove the outer protective layer of a composite pipe.

GB1458366 describes a tool for cutting a cable sheath which comprises a loop-like frame, including at least two hingedly connected parts, means for releasably holding the frame parts in closed loop form, a handle connected to the frame, and a cutter assembly mounted for adjustment both inwardly and outwardly of the loop and angularly about the axis of its inward and outward movement. The cable sheath is supported by rollers mounted on the frame and, in some embodiments, also on the cutter assembly. This tool is complex both in design and operation.

U.S. Pat. No. 3,943,626 describes a pipe cutter adapted to be mounted on a chain pipe wrench. The pipe cutter comprises a cutter bit which projects adjustable beyond a rigid body member mounted on guide wheels.

GB2207377 describes a plastic pipe cutter which comprises a set of pipe grips and a cutting tool ring. The cutting tool ring comprises two half round steel bands which are hinged and have a fastening clamp. The cutting tool is housed in a rigid slotted boss.

GB2145647 describes a tool for removing a surplus bead of material from a pipe. The tool comprises a blade carried in a rigid blade holder formed in two half body portions carried on releasable clampling means comprising a pair of semi-circular steel straps.

In GB2296886 there is described and claimed a pipe preparing tool which comprises:

- a frame having an opening adapted to receive a pipe or a portion thereof,
- a first tapered roller means mounted transversely on the frame;
- a second tapered roller means mounted transversely on the frame and spaced apart from the first tapered roller means;
- the arrangement being such that the first and second tapered roller means have opposed directions of taper;
- a cutting, scoring or penetrating means mounted on the frame and spaced apart from the first and second roller means; and
- clamping means adapted to apply a clamping force to the pipe such that the first and second tapered roller means and the cutting, scoring or penetrating means are brought into contact with the pipe and the cutting, scoring or penetrating means penetrates a surface layer of the pipe;
- the arrangement being such that the pipe and the tool can be rotated relatively to one another about the axis of the pipe whereby the cutting, scoring or penetrating means produces a helical groove in at least a surface layer of the pipe.

This tool works well in practice, and can be used to strip off the outer layer of a composite pipe, but again some further simplification of the design would be desirable. In particular, it would be desirable to provide a cheaper tool and one wherein the number of moving parts, such as rollers, can be reduced.

The tools of the prior art, for example that of GB2296886, can only be used to cut the pipe circumferentially i.e. by rotating the tool about the longitudinal axis of the pipe. The need for cutting the pipe longitudinally i.e. parallel to the longitudinal axis of the pipe is therefore not met by the prior art devices.

Further problems associated with a prior art include the need to carefully select the depth to which cutting occurs so as not to damage the underlying pipe.

There is sometimes the need to provide differently-sized tools to cope with pipes of different diameters. For example, the tool of GB2296886 is limited in that it can only be used for pipes of small enough diameter to fit between the rollers 5–8 and the sliding arm 12 at its maximum setting. Some prior art tools cannot cater for pipes which are out of round, for example slightly oval as a result of storage in a coil.

SUMMARY

It is therefore an object of the present invention to produce a pipe preparing tool of relatively simple construction capable of cutting or scoring the outer surface of a pipe and which alleviates the above-described problems. In appropriate embodiments, the outer protective layer can be penetrated so that it can readily be peeled cleanly away from the underlying pipe without any substantial damage to the underlying pipe.

In a first aspect of the present invention, there is provided a pipe preparing tool comprising

- a body having first and second contact points; and
- a cutter assembly mounted on the body between said contact points and freely slidable along an axis which is, in use, substantially perpendicular to the longitudinal axis of the pipe, and comprising a cutter adapted, in use, to engage a surface of the pipe when said contact points bear against the pine.

Preferably, the cutter is provided with a cutting blade which is angled, in use, with respect to the surface of the pipe.

Preferably, the cutter is provided with a heel located adjacent the cutting blade to prevent more than a predetermined depth of cut.

Preferably, in use, rotational movement of the cutter assembly about its longitudinal axis is substantially prevented.

Preferably, the cutter is removable from and replaceable in the cutter assembly.

Preferably, the body is provided with one or more wheels at each of said contact points. Ideally, each of said wheels is provided with a peripheral protrusion which, in use, reduces the contact area between the wheel and the outer surface of the pipe and impedes movement of the pipe preparing tool in a direction perpendicular to the plane of the wheel.

Preferably, the body is provided with means for attachment thereto of a flexible strap of a length sufficient to pass around the pipe.

Preferably, the cutter assembly, in use, occupies a position on the axis which bisects a chord between said first and second contact points.

In a second aspect of the invention, there is provided a pipe preparing tool comprising a cutter assembly mounted on a body for free movement relative to the body in a first direction, a cutter mounted in the assembly for engagement, in use, with a pipe surface, a tangential plane of which surface in contact with the cutter is substantially perpendicular said first direction, the tool being adapted for movement over said surface in a second direction substantially perpendicular said first direction, the cutter having a knife edge to cut into said surface, said edge being inclined with respect to said plane.

Preferably, said knife edge is substantially perpendicular said second direction.

Preferably, said knife edge has a distal end remote from a connection of the knife edge to the cutter, which distal end is adapted, in use, to coincide with an interface between a surface layer and an inner layer of the pipe. Ideally, said distal end is inclined with respect to said knife edge so as to lie substantially parallel said plane.

Preferably, said knife edge is inclined forwardly in the direction of cut.

In a third aspect of the invention, there is provided a method for cutting the outer surface of a pipe in which there is used a pipe preparing tool substantially as described above.

Preferred embodiments of the present invention will now be more particularly described, by way of example only, with reference to the accompanying drawings.

Figure 9A:
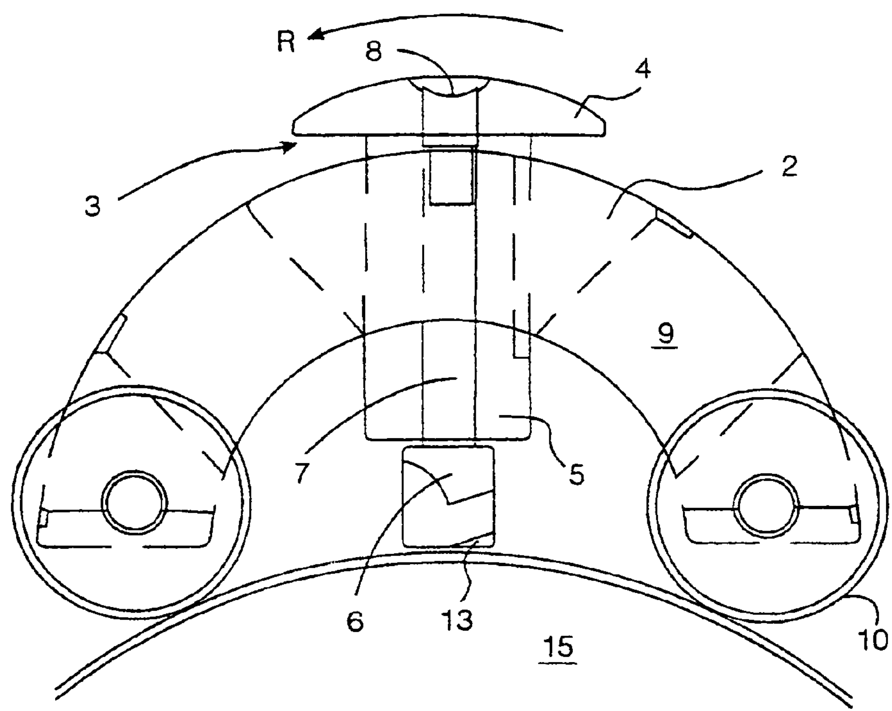
Figure 9B:
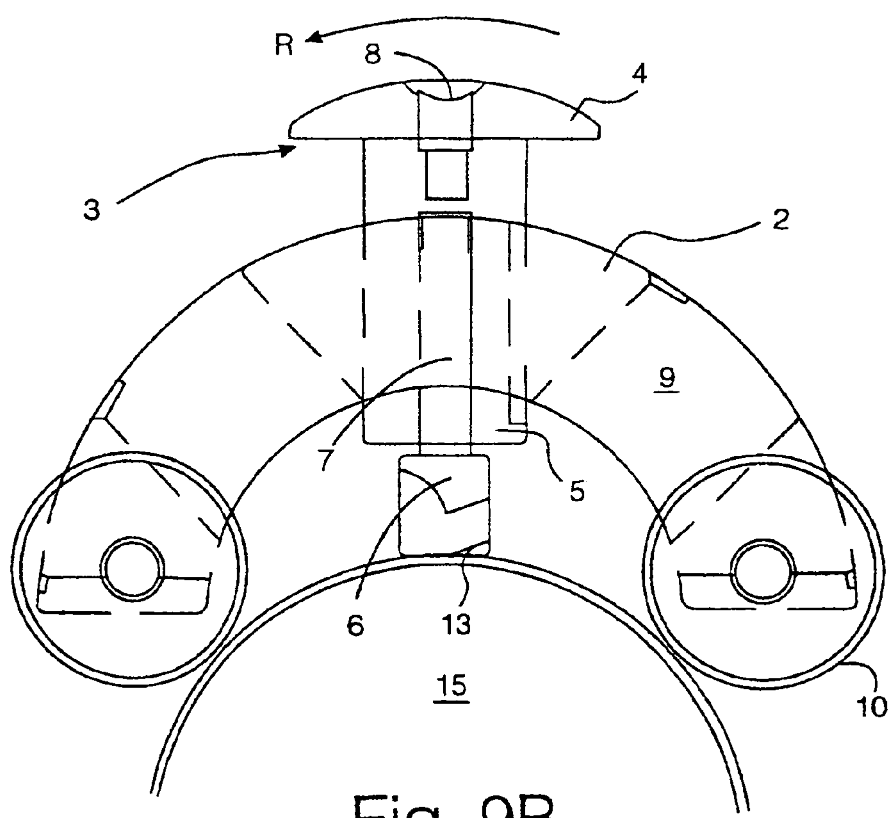
Figure 10:
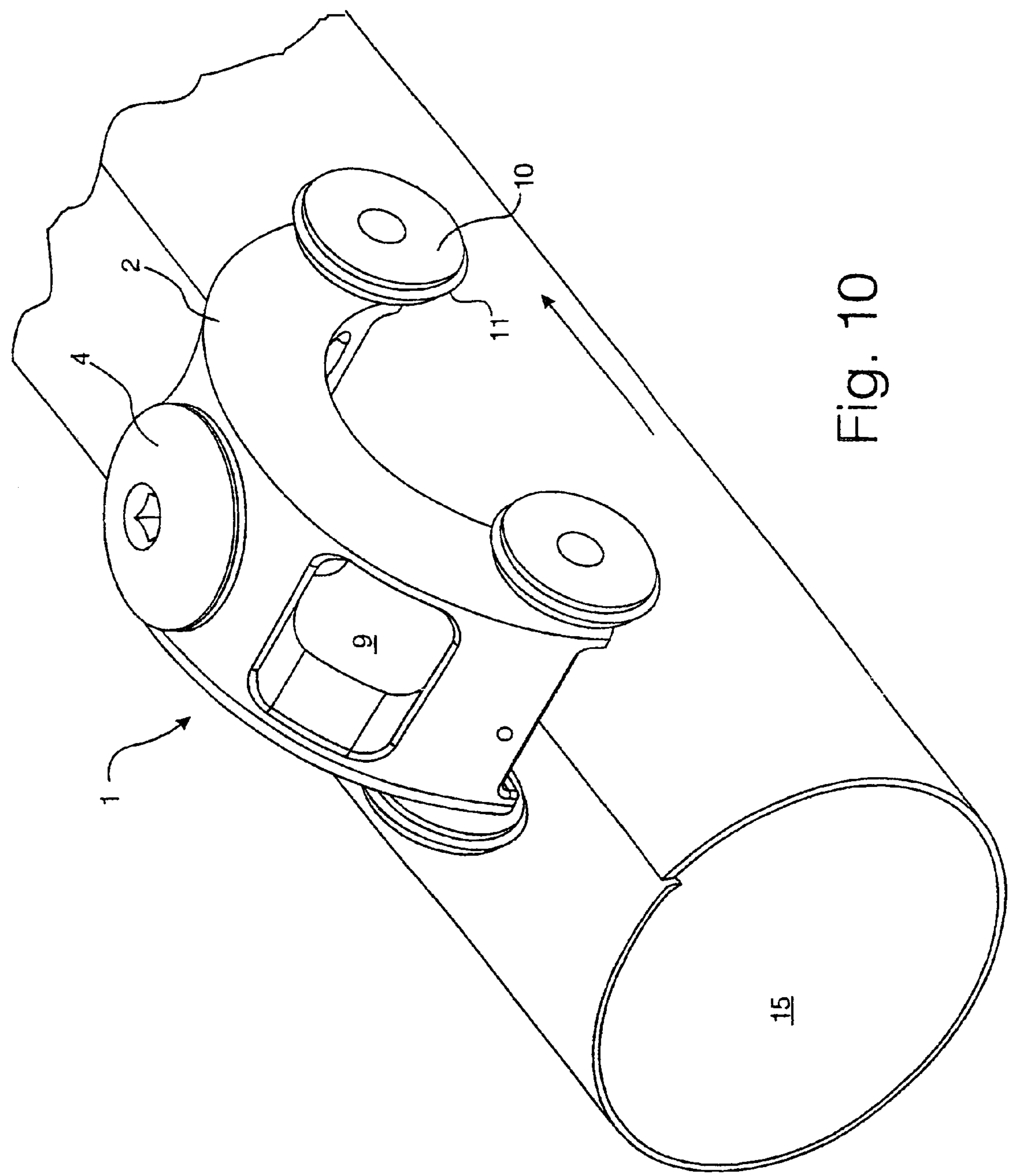
Figure 11:
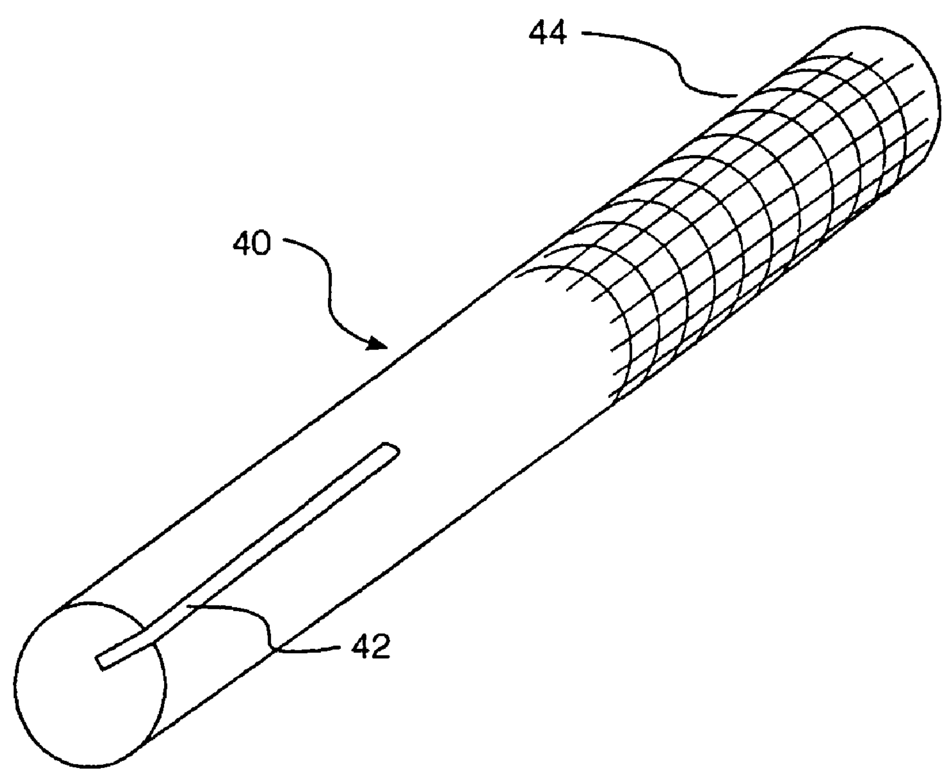

FIG. **5*a*** is a front view of the cutter and shaft assembly;

FIG. **5*b*** is a side view of the cutter and shaft assembly;

FIG. **6*a*** is a side view of the cutter assembly head and sleeve;

FIG. **6*b*** is a perspective view of the head and sleeve;

FIG. **6*c*** is an end view of the head and sleeve;

FIG. **7*a*** is a front view of one of the wheels;

FIG. **7*b*** is a perspective view of one of the wheels;

FIG. **7*c*** is a side view of one of the wheels;

FIG. **8*a*** is a side view of the cutter and shaft;

FIG. **8*b*** is a front view of the cutter and shaft;

FIG. **8*c*** is an end view of the cutter and shaft;

FIG. **8*d*** is a perspective view of the cutter and shaft;

FIG. 9A is a side view, partly in section, of a pipe preparing tool in position on a pipe of relatively large diameter;

FIG. 9B is a side view, partly in section, of a pipe preparing tool in position on a pipe of relatively small diameter;

FIG. 10 is a perspective view of the pipe preparing tool positioned longitudinally on a pipe; and FIG. 11 is a perspective view of a suitable tool to assist skin removal.

DETAILED DESCRIPTION OF THE INVENTION

Referring to FIGS. 1–4, the pipe preparing tool 1 comprises a generally arcuate body 2 of cast metal. A cutter assembly 3 is mounted on a body as shown, such that it is moveable relative to the body 2 as indicated by arrow C. Rotational movement (as indicated by arrow R) is substantially prevented.

The cutter assembly comprises a dome-shaped head 4 which, in use, serves as a handle which is easily gripped by the user of the pipe preparing tool. The head 4 is rigidly fixed to a substantially cylindrical sleeve S. At the end of the sleeve 5 remote from the head 4 is the cutter 6 itself. Although in use, the cutter 6 is firmly fixed in position, the cutter may be removable and replaceable. This is facilitated by the construction shown in FIG. 2, wherein it can be seen that the cutter 6 is mounted on a shaft 7 which passes though the centre of sleeve 5 to head 4, where it is held in place by a screw 8, which is received in a threaded hole 8' on a square section 7' of the shaft 7. The square section 7' is received in a corresponding square bore 4' of the head 4. Thus the cutter is rotationally fixed with respect to the head 4.

On loosening the screw 8, the cutter 6 and its shaft 7 can be easily removed from the sleeve 5 and the old cutter 6 can be substituted by a new cutter; the new cutter and shaft 7 then simply being replaced into the pipe preparing tool and screwed back into position.

The body 2 is provided with one or more apertures 9, which facilitate the gripping of the pipe preparing tool when the device is in use.

Figure 2:
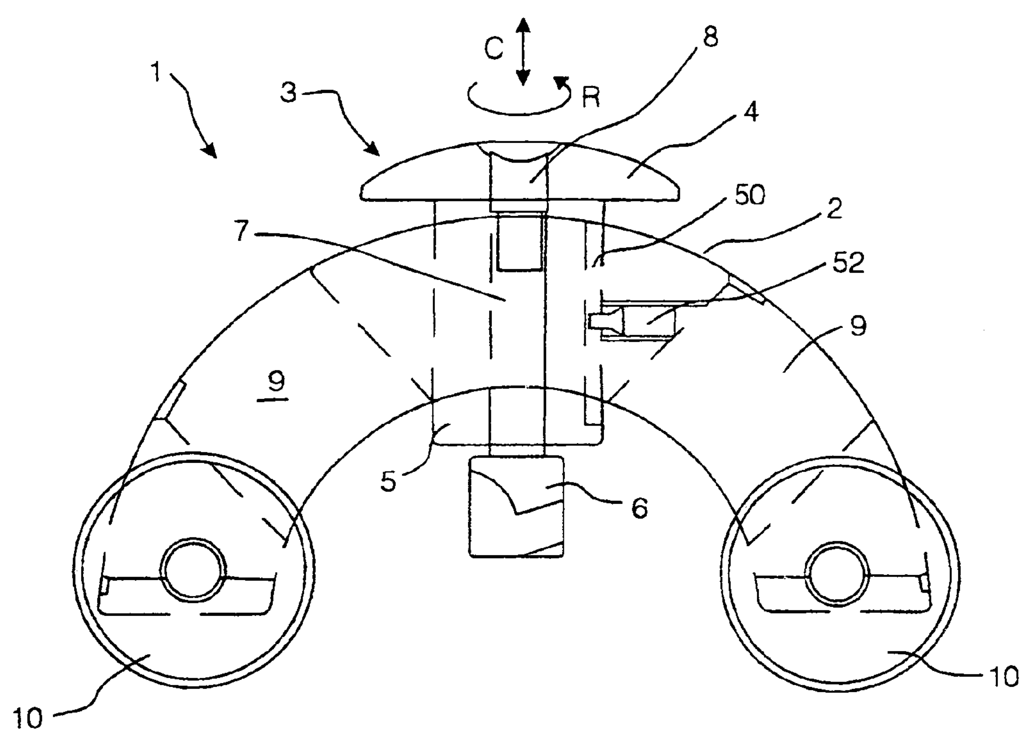
FIG. 2 is a side view, partly in section, of the pipe preparing tool of FIG. 1.
Figure 3:
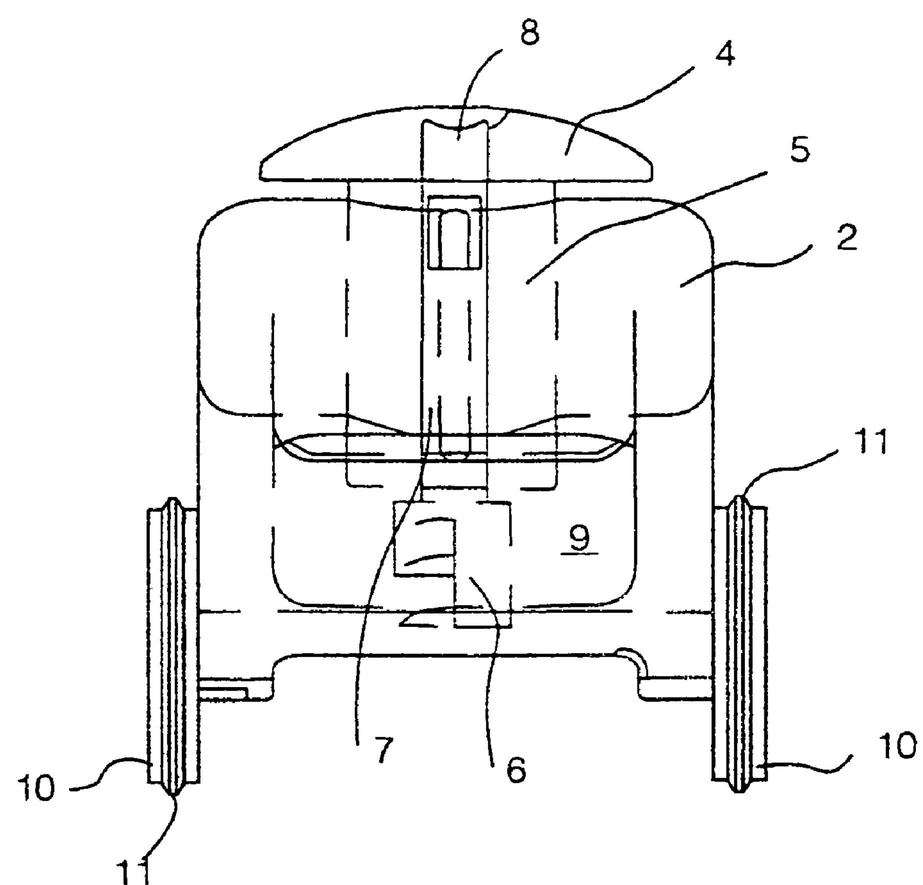
FIG. 3 is an end view, partly in section, of the pipe preparing tool of FIG. 1.
Figure 4:
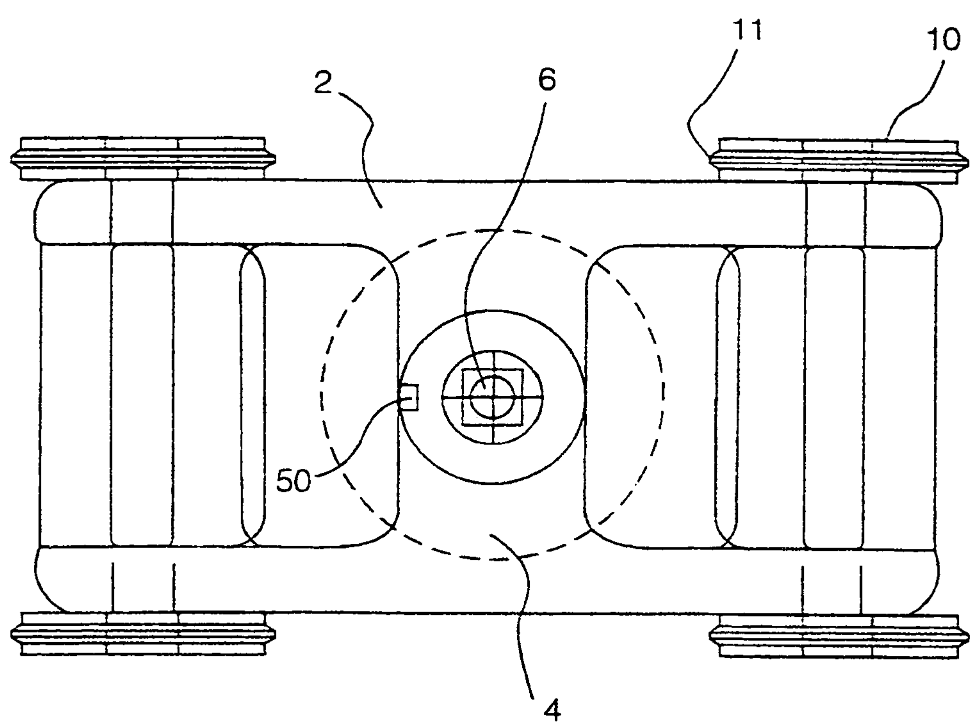
FIG. 4 is a plan view, partly in section, of the pipe preparing tool of FIG. 1.

The sleeve 5 is provided with an elongate peripheral slot 50 (shown in FIGS. 2 and 4) into which can be inserted a set screw 52 as shown in FIG. 2. Access to the set screw 52 is provided through one of the apertures 9. Tightening of the set screw 52 prevents rotational movement of the sleeve 5 with respect to the body 2.

The parts of the body 2 which are intended to be in contact with the pipe, when the tool is in use, are provided with wheels 10 which rest on the outer surface of the pipe when the tool is in use. Any other suitable friction-reducing means could alternatively be used, although the wheels 10 are particularly advantageous in that they are provided with a protruding rim 11 which, whilst allowing forward or backward movement of the wheels, impedes lateral movement of the pipe preparing tool. The wheels 10 are press-fitted to the body 2.

Figure 1:
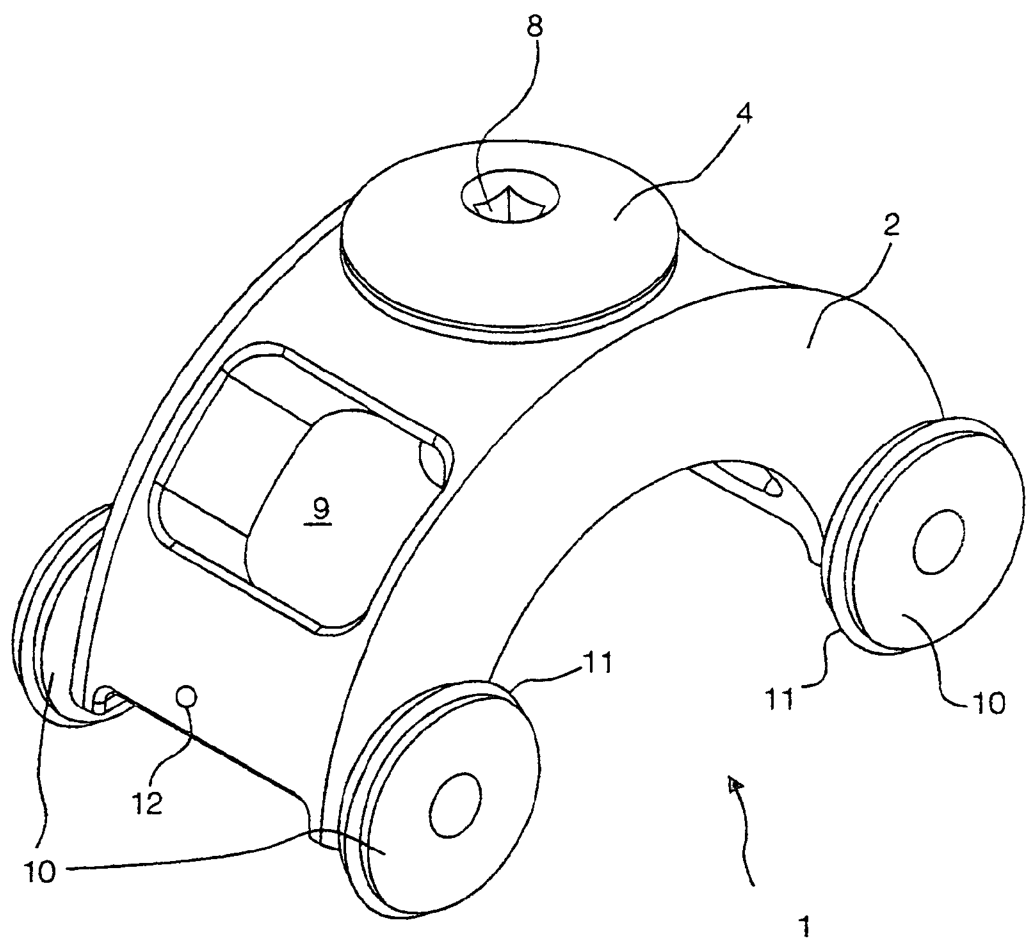
FIG. 1 is a perspective view of a pipe preparing tool embodying the first aspect of the present invention.

The body 2 is optionally provided with a protruding stud 12 between each pair of wheels, as shown in FIG. 1. This enables an elasticated strap (not shown) of known type to be attached to the pipe preparing tool to enable the tool to be held tightly against the pipe whose surface is to be cut.

Referring, in particular, to FIGS. **5*a* and 5*b*, the cutter 6 is freely moveable in a first direction or axis 20 by virtue of the head 4 being slidable in the body. The cutter 6 has a cutting blade 13. The leading point at which the cutting blade 13 contacts the outer layer of the pipe is point X, shown in FIG. 5**B.

The blade 13 is formed by grinding a circular groove 22 in the cylindrical head 6' of the cutter, followed by an angled saw cut 24. Finally the so formed blade 13 is deflected downwardly.

Where point X contacts a pipe surface, a tangential plane of the pipe is defined. When the tool 1 is cutting circumferentially of the pipe, that plane will be parallel the plane of the wheels 10 and perpendicular the axis 20.

The cutting edge 13' is arranged substantially perpendicular to the direction of cut (i.e. the direction of travel of the wheels 10) and inclined downwardly with respect to the plane of the wheels (the tangential plane).

Figure 5A:
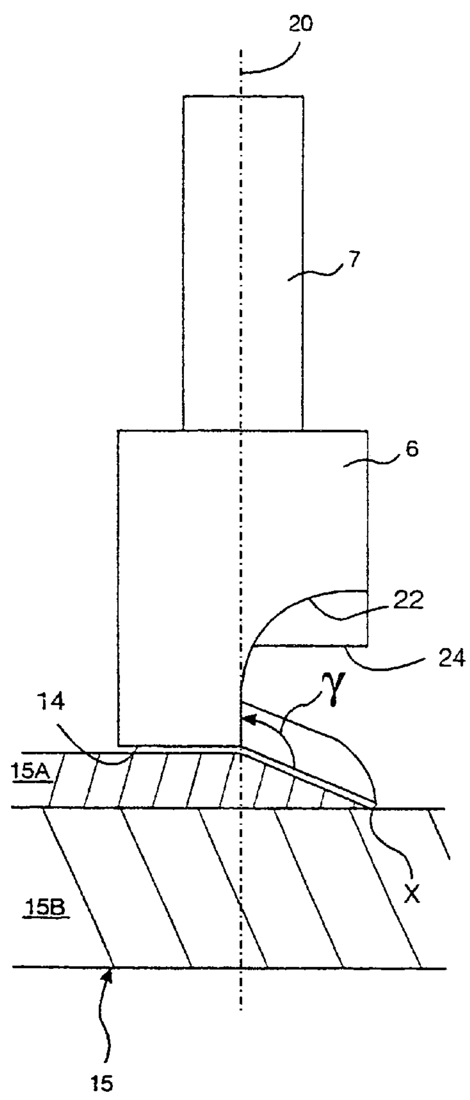
Figure 5B:
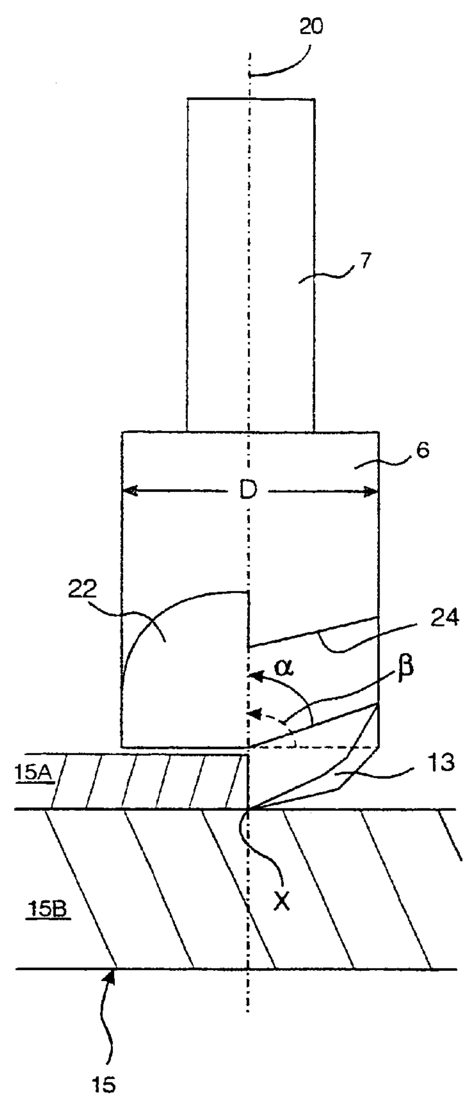

FIG. 5A shows a pipe 15 having a skin 15*a* and an inner layer 15*b*. In pipes to which the present invention relates, the thickness of the skin is substantially constant, regardless of the diameter of the pipe and the length and inclination of the blade 13 is arranged so that its tip X is below the level of the interface between the skin and inner layer.

A flat portion or heel 14 is provided beside the cutting blade 13, as shown in FIG. 5A, which serves to prevent "submarining" of the blade into the outer surface of the pipe during the cutting operation.

It has been found that the most appropriate dimensions and angles for the cutter are a cutter diameter D of about 8 mm, so that the length of the cutting blade 13 is about 4 mm. The angle or inclination a of the slot 24 with respect to the axis 20 is about 70°. The base of the cutting blade is ground to an angle β of about 87° with respect to the axis, ideally before the slot 24 is cut. The angle of inclination γ of the blade 13 is about 99° to the axis 20.

Use of the pipe preparing tool according to the present invention will now be described with reference to FIGS. 9 and 10.

The following description explains how the pipe preparing tool of the present invention can be used to cut through the outer protective skin of a pipe so that the skin may be readily peeled away, without causing any substantial damage to the underlying pipe. It will be appreciated, however, that the pipe preparing tool of the present invention is also suitable for cutting or scoring the outer surface of a plastics pipe which does not have such an outer protective skin.

To use the pipe preparing tool, the tool 1 is placed on the surface of a pipe 15 with the wheels 10 resting on the surface, thus forming the contact points between the tool and the pipe.

The cutter assembly 3 is slidable in the body 2, in the direction indicated by arrow S in FIG. 9B so that the cutter 6 can be brought into contact with the surface of the pipe 15, regardless of its diameter. This can be seen by comparing FIG. 9A, where a pipe of relatively large diameter is shown, with FIG. 9B where a pipe of relatively small diameter is shown.

When the tool is in position, the user applies a downward force onto head 4 so as to cause the cutting blade 13 to engage with the skin or the pipe 15. At the same time the tool is advanced around the pipe until the cutting blade penetrates the surface of the pipe.

Once the cutting blade 13 is lodged under the skin of the pipe, the pipe preparing tool can be rotated around the periphery of the pipe, in the direction indicated by arrow R in FIG. 9A. The relative movement of the pipe preparing tool and the pipe enables a cut to be made in the surface of the pipe.

The design of the cutting blade 13 is such that, after the initial cut is made into the skin, downward pressure on the head 4 is no longer required as the tool travels around the periphery of the pipe, cutting the skin away from the underlying pipe. The cutting blade 13, or at least its point X, "settles" at the interface between the skin and the underlying pipe and resists any forces tending to eject the cutting blade from the cut it is making. Movement of the cutter assembly 3, which is freely slidable in direction S whilst the cutting action takes place, permits the blade to stay in this settled position.

Moreover, the freely sliding movement of the cutter assembly in direction S means that, not only can the tool readily cope with pipes of different diameters, but also that it can cope with pipes which are out of round, for example slightly oval (as is caused when pipes are stored on a coil). Once the cutting blade 13 has settled at the interface between the skin and the underlying pipe, variations in diameter can be easily coped with, the cutter assembly automatically moving up or down, as shown by arrow S, to compensate.

The skin is lifted or "flared" where it contacts the angled blade so that it can easily be gripped and peeled away from the underlying pipe. A suitable tool to assist skin removal is shown in FIG. 11 and comprises a metal rod 40 having a longitudinal slot 42 therein, into which a piece of the flared skin can be placed, the rod then being rotated (using handle 44) to wind the skin around the rod, in the manner of a lid of a sardine can being wound around a metal key. Ideally the slot is chordal rather than radial.

A significant advantage over the prior art devices is that the pipe preparing tool of the present invention can also be used in a longitudinal orientation, as shown in FIG. 10. The tool is simply turned through 90° from the orientation shown in FIG. 9, so that a cut can be made in the pipe parallel to its longitudinal axis. The operation of the tool is the same as in the FIG. 9 orientation, the angled shape of blade 13 meaning that point X is still the leading point at which the blade 13 contacts the outer layer of the pipe. In this instance, the tangential plane of contact may not be absolutely perpendicular the axis 20.

The present invention therefore provides a pipe preparing tool which is both simple and effective to use in either the FIG. 9 or the FIG. 10 orientation. It can readily cope with pipes of different diameters or with pipes which are not perfectly round and does not require a particularly high downward force to be applied in order to cut the skin of a pipe.

Furthermore, the tool is safer than some prior art devices as the blade is protected by the body of the tool, which is in itself very stable and not prone to slippage.

The tendency for lateral slippage is further reduced by the protruding rims 11 on the wheels, which improve the grip of the wheels on the surface of the pipe. This minimisation of the contact area between the tool and pipe also serves to reduce the likelihood of contamination reaching the cut portion of the pipe.

What is claimed is:

1. A pipe preparing tool comprising:

a body having first and second contact points and a bore through the body;

a cutter assembly on the body between the first and second contact points, the cutter assembly being freely slidable in the bore along an axis that is substantially perpendicular to a line connecting the first and second contact points; and a cutter on the cutter assembly;

wherein the cutter assembly comprises has first and second ends, the first end protruding from the body and comprising a user engagement head, and the second end holding the cutter during contact with a surface of a pipe when the first and second contact points are also in contact with the pipe; and wherein the cutter comprises:

a blade having a portion that is skewed at an angle relative to the line and the surface of the pipe when the first and second contact points contact the pipe, the angle of the portion relative to the surface of the pipe causing the blade to be drawn into the surface of the pipe when the tool is moved over the pipe, and the blade comprising a cutting edge that is substantially orthogonal to the line; and a heel adjacent to the blade to prevent the blade from cutting to more than a predetermined depth into the pipe.

2. The pipe preparing tool of claim 1, wherein, the body and the cutter assembly together include a pin and a slot, the slot being substantially parallel to the axis, the pin being slidable along the slot, wherein engagement between the slot and the pin inhibits rotational movement of the cutter assembly about the axis.

3. The pipe preparing tool of claim 1, wherein the cutter is removable from, and replaceable in, the cutter assembly.

4. The pipe preparing tool of claim 1, wherein the body is comprises one or more wheels at each of the first and second contact points.

5. The pipe preparing tool of claim 4, wherein each of the one or more wheels has a peripheral protrusion that reduces a contact area between a wheel and the pipe and that impedes movement of the pipe preparing tool in a direction perpendicular to a plane of the wheel.

6. The pipe preparing tool of claim 1, further comprising a flexible straps;

wherein the body comprises means for attaching the flexible strap.

7. The pipe preparing tool of claim 1, wherein the axis substantially bisects a chord between the first and second contact points.

8. The pipe preparing tool of claim 1, wherein the blade has a distal end that is remote from a connection of the blade to the cutter.

9. The pipe preparing tool of claim 1, wherein each of the first and second contact points comprises a pair of spaced contact wheels, each pair of spaced contact wheels having coincident axles that are substantially perpendicular to the line.

10. A method for cutting the surface of the pipe using the pipe preparing tool of claim 1, the method comprising:

engaging the pipe preparing tool with the pipe so that the first and second contact points contact the pipe;

pressing the cutter assembly via the user engagement head to cause the blade to contact the surface of the pipe; and moving the pipe preparing tool over the surface of the pipe so that the blade cuts into the surface of the pipe.

11. A tool comprising:

a body having first and second contact points and a bore through the body;

a cutter assembly on the body between the first and second contact points, the cutter assembly being freely slidable in the bore along an axis that is substantially perpendicular to a line connecting the first and second contact points; and a cutter on the cutter assembly;

wherein the cutter assembly comprises first and second ends, the first end protruding from the body and comprising a user engagement head, and the second end holding the cutter during contact with a surface of an element to be cut when the first and second contact points are also in contact with the element; and wherein the cutter comprises:

a blade having a portion that is skewed at an angle relative to the line and the surface of the element when the first and second contact points contact the element, the blade comprising a cutting edge that is substantially orthogonal to the line; and a heel adjacent to the blade to prevent the blade from cutting to more than a predetermined depth into the element.

12. The tool of claim 11, wherein, the body and the cutter assembly together include a pin and a slot, the slot being substantially parallel to the axis, the pin being slidable along the slot, wherein engagement between the slot and the pin inhibits rotational movement of the cutter assembly about the axis.

13. The tool of claim 11, wherein the cutter is removable from, and replaceable in, the cutter assembly.

14. The tool of claim 11, wherein the body comprises one or more wheels at each of the first and second contact points.

15. The tool of claim 14, wherein each of the one or more wheels has a peripheral protrusion that reduces a contact area between a wheel and the element and that impedes movement of the tool in a direction perpendicular to a plane of the wheel.

16. The tool of claim 11, further comprising:

a flexible strap;

wherein the body comprises means for attaching the flexible strap.

17. The tool of claim 11, wherein the axis substantially bisects a chord between the first and second contact points.

18. The tool of claim 11, wherein the blade has a distal end that is remote from a connection of the blade to the cutter.

19. The tool of claim 11, wherein each of the first and second contact points comprises a pair of spaced contact wheels, each pair of spaced contact wheels having coincident axles that are substantially perpendicular to the line.

20. A method, in which the element is a pipe, for cutting the surface of the pipe using the tool of claim 11, the method comprising:

engaging the tool with the pipe so that the first and second contact points contact the pipe;

pressing the cutter assembly via the user engagement head to cause the blade to contact the surface of the pipe; and moving the tool over the surface of the pipe so that the blade cuts into the surface of the pipe.

* * * * *